(12) United States Patent
Luby et al.

(10) Patent No.: US 7,447,235 B2
(45) Date of Patent: Nov. 4, 2008

(54) FEC-BASED RELIABILITY CONTROL PROTOCOLS

(75) Inventors: Michael Luby, Berkeley, CA (US); Matt Doucleff, Berkeley, CA (US); Avi Wigderson, Princeton, NJ (US); Soren Lassen, San Francisco, CA (US)

(73) Assignee: Digital Fountain, Inc., Fremont, CA (US)

( * ) Notice: Subject to any disclaimer, the term of this patent is extended or adjusted under 35 U.S.C. 154(b) by 450 days.

(21) Appl. No.: 10/962,373

(22) Filed: Oct. 8, 2004

(65) Prior Publication Data

US 2005/0226272 A1 Oct. 13, 2005

Related U.S. Application Data

(60) Provisional application No. 60/509,976, filed on Oct. 8, 2003.

(51) Int. Cl.
*H04L 1/12* (2006.01)
(52) U.S. Cl. ..................... 370/476; 341/107; 714/774
(58) Field of Classification Search ............. 370/229, 370/230, 231, 390, 389, 235, 236, 341, 474, 370/476, 477; 341/107; 714/774
See application file for complete search history.

(56) References Cited

U.S. PATENT DOCUMENTS

| | | | |
|---|---|---|---|
| 6,411,231 B1 | 6/2002 | Yanagiya et al. | |
| 6,614,366 B2 | 9/2003 | Luby | |
| 6,677,864 B2 * | 1/2004 | Khayrallah | ............... 341/50 |
| 6,954,617 B2 * | 10/2005 | daCosta | ............... 455/63.1 |
| 6,983,009 B2 * | 1/2006 | Lomp | ............... 375/149 |
| 7,095,729 B2 * | 8/2006 | Sachs et al. | ............... 370/341 |
| 7,254,140 B1 * | 8/2007 | Rokhsaz et al. | ............... 370/465 |
| 2004/0001460 A1 * | 1/2004 | Bevan et al. | ............... 370/331 |
| 2004/0176947 A1 * | 9/2004 | Miyake et al. | ............... 704/201 |
| 2005/0013303 A1 * | 1/2005 | Gopalakrishnan et al. | ............... 370/395.21 |

FOREIGN PATENT DOCUMENTS

WO          WO 96/34463 A1          10/1996

\* cited by examiner

*Primary Examiner*—Melvin Marcelo
(74) *Attorney, Agent, or Firm*—Philip H. Albert; Townsend and Townsend and Crew

(57) ABSTRACT

In a transport system, data is reliably transported from a sender to a receiver by organizing the data to be transported into data blocks, wherein each data block comprises a plurality of encoding units, transmitting encoding units of a first data block from the sender to the receiver, and detecting, at the sender, acknowledgments of receipt of encoding units by the receiver. At the sender, a probability that the receiver received sufficient encoding units of the first data block to recover the first data block at the receiver is detected and the probability is tested against a threshold probability to determine whether a predetermined test is met. Following the step of testing and prior to the sender receiving confirmation of recovery of the first data block at the receiver, when the predetermined test is met, transmitting encoding units of a second data block from the sender. If an indication of failure to recover the first data block is received at the sender, sending further encoding units for the first data block from the sender to the receiver. In some embodiments, the predetermined test is a comparison of the probability against the threshold probability and the predetermined test is met when the probability is greater than the threshold probability.

9 Claims, 11 Drawing Sheets

Sender data format

Receiver feedback format

Two active blocks

Example data packet sending pattern
over time

Sender data format

Receiver feedback format

FEC-BASED RELIABILITY CONTROL PROTOCOLS

CROSS-REFERENCE TO RELATED APPLICATIONS

This application claims priority from co-pending U.S. Provisional Patent Application No. 60/509,976 filed Oct. 8, 2003 entitled FEC-BASED RELIABILITY CONTROL PROTOCOLS which is hereby incorporated by reference, as if set forth in full in this document, for all purposes.

BACKGROUND

The present invention relates to the problem of rapid transmission of data between end systems over a data communication network.

Many data communication systems and high level data communication protocols offer the convenient communication abstractions of reliable data transport, and provide rate control, i.e., they automatically adjust their packet transmission rate based on network conditions. Their traditional underlying implementations in terms of lower level packetized data transports, such as the ubiquitous Transport Control Protocol (TCP), suffer when at least one of the following conditions occurs: (a) the connection between the sender(s) and the receiver(s) has a large round-trip time (RTT); (b) the amount of data is large and the network suffers from bursty and transient losses.

One of the most widely used reliable transport protocols in use today is the Transport Control Protocol (TCP). TCP is a point-to-point packet control scheme in common use that has an acknowledgment mechanism. TCP works well for one-to-one reliable communications when there is little loss between the sender and the recipient and the RTT between the sender and the recipient is small. However, the throughput of the TCP drops drastically when there is even very little loss, or when the sender and the recipient are far apart.

Using TCP, a sender transmits ordered packets and the recipient acknowledges receipt of each packet. If a packet is lost, no acknowledgment will be sent to the sender and the sender will resend the packet. With protocols such as TCP, the acknowledgment paradigm allows packets to be lost without total failure, since lost packets can just be retransmitted, either in response to a lack of acknowledgment or in response to an explicit request from the recipient.

TCP provides both reliability control and rate control, i.e., it ensures that all of the original data is delivered to receivers and it automatically adjusts the packet transmission rate based on network conditions such as congestion and packet loss. With TCP, the reliability control protocol and the rate control protocol are intertwined and not separable. Moreover, TCP's throughput performance as a function of increasing RTT and packet loss is far from optimal.

Studies by many researchers have shown that, when using TCP, the throughput of the data transfer is inversely proportional to the product of the RTT, and the square root of the inverse of the loss rate on the end-to-end connection. For example, a typical end-to-end terrestrial connection between the U.S. and Europe has an RTT of 200 milliseconds and an average packet loss of 2%. Under these conditions, the throughput of a TCP connection is at most around 300-400 Kilobits per second (kbps), no matter how much bandwidth is available end-to-end. The situation is more severe on a satellite link, where in addition to high RTTs, information is lost due to various atmospheric effects. A primary reason for TCP's poor performance in these types of conditions is that the rate control protocol used by TCP does not work well in these conditions, and since the reliability control protocol and rate control protocol used by TCP are inseparable, this implies that the overall TCP protocol does not work well in these conditions. Furthermore, the requirements of different applications for transport vary, yet TCP is used fairly universally for a variety of applications in all network conditions, thus leading to poor performance in many situations.

What would be desirable is if the reliability control and rate control protocols used by the overall transport protocol were independent, and then the same reliability control protocol could be used with a variety of different rate control protocols so the actual rate control protocol chosen can be based on application requirements and the network conditions in which the application is run. The paper "A Modular Analysis of Network Transmission Protocols", Micah Adler, Yair Bartal, John Byers, Michael Luby, Danny Raz, Proceedings of the Fifth Israeli Symposium on Theory of Computing and Systems, June 1997 (hereinafter referred to as "Adler" and incorporated by reference herein), introduces a modular approach to building transport protocols that advocates partitioning a reliable transport protocol into independent reliability control and rate control protocols.

For any reliability control protocol, two primary measures of its performance are how much buffering is required and what is its "goodput." Buffering is introduced in a reliability control protocol at both the sender and receiver. Buffering at the sender occurs, for example, when data is buffered after it is initially sent until the sender has an acknowledgement that it has been received at the receiver. Buffering at the receiver occurs for similar reasons. Buffering is of interest for two reasons: (1) it directly impacts how much memory the sender and receiver reliability control protocol uses; (2) it directly impacts how much latency the sender and receiver reliability control protocol introduces. Goodput is defined as the size of the data to be transferred divided by the amount of sent data that is received at the receiver end system during the transfer. For example, goodput=1.0 if the amount of data sent in packets to transfer the original data is the size of the original data, and goodput=1.0 can be achieved if no redundant data is ever transmitted.

Adler outlines a reliability control protocol that is largely independent of the rate control protocol used, which is hereafter referred to as the "No-code reliability control protocol". The No-code reliability control protocol is in some ways similar to the reliability control protocol embedded in TCP, in the sense that the original data is partitioned into blocks and each block is sent in the payload of a packet, and then an exact copy of each block needs to be received to ensure a reliable transfer. An issue with the No-code reliability control protocol is that, although the goodput is optimal (essentially equal to one), the buffering that the No-code reliability control protocol introduces can be substantial when there is packet loss. Adler proves that the No-code reliability control protocol is within a constant factor of optimal among reliability control protocols that do not use coding to transport the data, in the sense that the protocol has optimal goodput and provably is within a constant factor of optimal in terms of minimizing the amount of buffering needed at the sender and receiver.

One solution that has been used in reliability control protocols is Forward Error-Correction (FEC) codes, such as Reed-Solomon codes or Tornado codes, or chain reaction codes (which are information additive codes.) Using FEC codes, the original data is partitioned into blocks larger than the payload of a packet and then encoding units are generated from these blocks and send the encoding units in packets. One basic advantage of this approach versus reliability control protocols that do not use coding is that the feedback can be much simpler and less frequent, i.e., for each block the receiver need only indicate to the sender the quantity of encoding units received instead of a list of exactly which encoding units are received. Furthermore, the ability to generate and send more encoding units in aggregate than the length of the original data block is a powerful tool in the design of reliability control protocols.

Erasure correcting codes, such as Reed-Solomon or Tornado codes, generate a fixed number of encoding units for a fixed length block. For example, for a block comprising B input units, N encoding units might be generated. These N encoding units may comprise the B original input units and N-B redundant units. If storage permits, then the sender can compute the set of encoding units for each block only once and transmit the encoding units using a carousel protocol.

One problem with some FEC codes is that they require excessive computing power or memory to operate. Another problem is that the number of encoding units needed must be determined in advance of the coding process. This can lead to inefficiencies if the loss rate of packets is overestimated, and can lead to failure if the loss rate of packets is underestimated.

For traditional FEC codes, the number of possible encoding units that can be generated is of the same order of magnitude as the number of input units a block is partitioned into. Typically, but not exclusively, most or all of these encoding units are generated in a preprocessing step before the sending step. These encoding units have the property that all the input units can be regenerated from any subset of the encoding units equal in length to the original block or slightly longer in length than the original block.

Chain reaction decoding described in U.S. Pat. No. 6,307,487 (hereinafter "Luby I" and incorporated by reference herein) can provide a form of forward error-correction that addresses the above issues. For chain reaction codes, the pool of possible encoding units that can be generated is orders of magnitude larger than the number of the input units, and a randomly or pseudo randomly selected encoding unit from the pool of possibilities can be generated very quickly. For chain reaction codes, the encoding units can be generated on the fly on an "as needed" basis concurrent with the sending step. Chain reaction codes allow that all input units of the content can be regenerated from a subset of a set of randomly or pseudo randomly generated encoding units slightly longer in length than the original content.

Other documents such as U.S. Pat. Nos. 6,320,520, 6,373,406, 6,614,366, 6,411,223, 6,486,803, and U.S. Patent Publication No. 20030058958 (hereafter referred to as "Shokrollahi I"), describe various chain reaction coding schemes and are incorporated herein by reference.

A sender using chain reaction codes can continuously generate encoding units for each block being sent. The encoding units may be transmitted via the User Datagram Protocol (UDP) Unicast, or if applicable UDP Multicast, to the recipients. Each recipient is assumed to be equipped with a decoding unit, which decodes an appropriate number of encoding units received in packets to obtain the original blocks.

One of the several transports available in the Transporter Fountain™ network device available from Digital Fountain is a reliable transport protocol that uses a simple FEC-based reliability control protocol that can be combined with a variety of rate control protocols. This simple FEC-based reliability control protocol is hereinafter referred to as the "TF reliability control protocol". The TF reliability control protocol transmits encoding units for a given block of data until receiving an acknowledgement from the receiver that enough encoding units have been received to recover the block, and then the sender moves on to the next block.

Let RTT be the number of seconds it would take from when the sender sends a packet until the sender has received an acknowledgement from the receiver that the packet has arrived, and let R be the current sending rate of the sender in units of packets/second, and let B be the size of a block in units of packets. Using the TF reliability control protocol, the number of useless packets containing encoding units for a block sent subsequent to the last packet needed to recover the block is $N=R*RTT$. Thus, a fraction $f=N/(B+N)$ of the packets sent are wasted, and thus the goodput is at most $1-f$. For example, if $R=1,000$ packets/second, $RTT=1$ second, and $B=3,000$ packets, then $f=0.25$, i.e., 25% of the received packets are wasted. Thus, the goodput in this example is a meager 0.75 (compared to a maximum possible goodput of 1.0).

Note also in this example that the size of a block B together with the rate R implies that the latency introduced by the simple FEC-based reliability control protocol is at least 4 seconds (each block is transmitted for 4 seconds total), and requires buffering at least one block, i.e., 3,000 packets of data. Furthermore, to increase the goodput requires increasing the buffering, or conversely to decrease the buffering requires decreasing the goodput.

In view of the above, improvements in reliability control are desirable.

SUMMARY OF THE INVENTION

In a transport system according to embodiments of the present invention, data is reliably transported from a sender to a receiver by organizing the data to be transported into data blocks, wherein each data block comprises a plurality of encoding units, transmitting encoding units of a first data block from the sender to the receiver, and detecting, at the sender, acknowledgments of receipt of encoding units by the receiver. At the sender, a probability that the receiver received sufficient encoding units of the first data block to recover the first data block at the receiver is detected and the probability is tested against a threshold probability to determine whether a predetermined test is met. Following the step of testing and prior to the sender receiving confirmation of recovery of the first data block at the receiver, when the predetermined test is met, transmitting encoding units of a second data block from the sender. If an indication of failure to recover the first data block is received at the sender, sending further encoding units for the first data block from the sender to the receiver. In some embodiments, the predetermined test is a comparison of the probability against the threshold probability and the predetermined test is met when the probability is greater than the threshold probability.

DETAILED DESCRIPTION OF THE INVENTION

Figure 1:
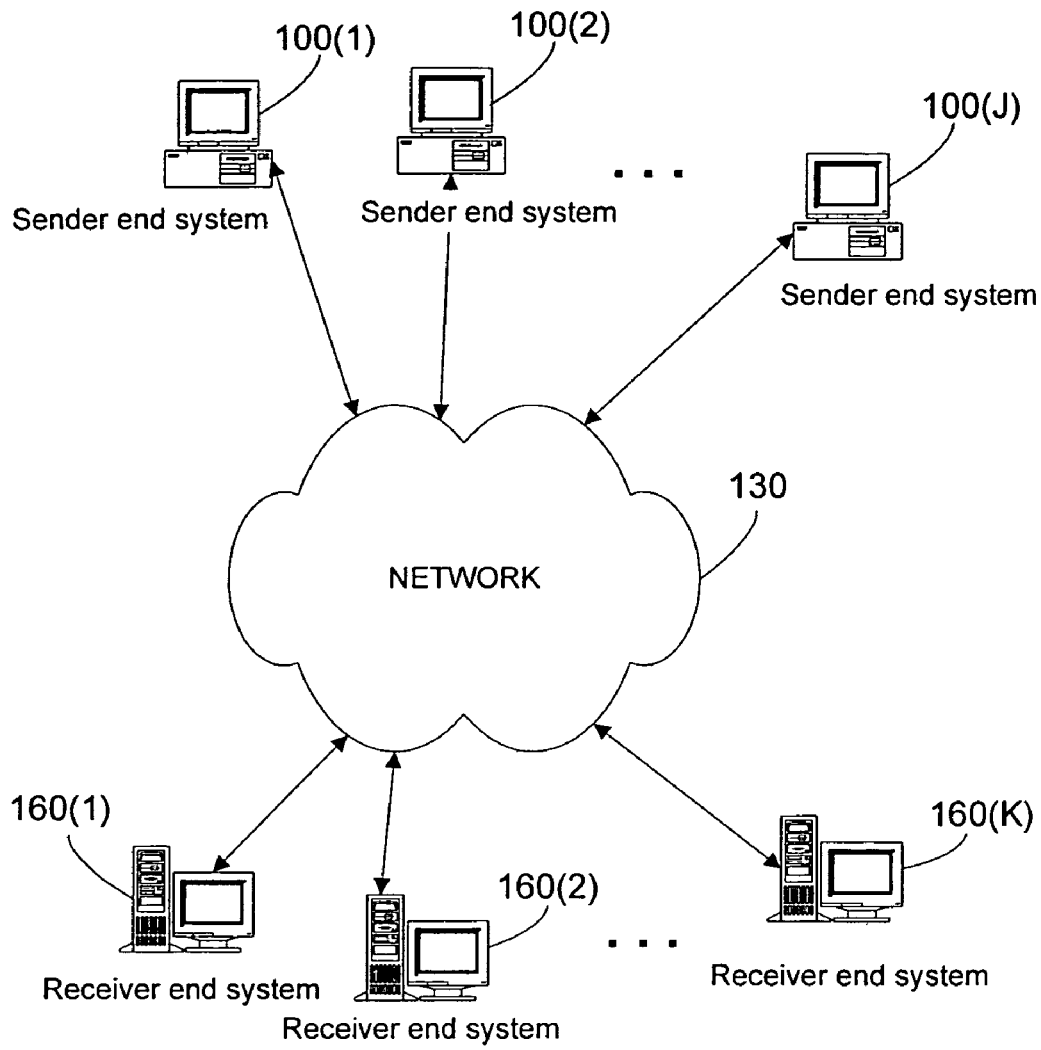
FIG. 1 is a block diagram of an embodiment of a network, sender end systems and receiver end systems that might use the teachings of the present invention.

In embodiments of the present invention, interleaved reliability control protocols are used to provide improvements over TCP, the TF reliability control protocol and the No-code reliability control protocol. With a reliability control protocol, blocks of data are sent as a series of encoding units from a sender to a receiver and the receiver acknowledges recovery of the encoding units or the blocks, thereby allowing the sender to determine whether the receiver received the data and if not received, retransmit the data, or transmit other data usable to recover the received data. One property of some interleaved reliability control protocols is that encoding units for different blocks are sent in an interleaved fashion. Interleaved reliability control protocols have a property that, when combined with virtually any rate control protocol, they provide an efficient reliable data transport that minimizes buffering (and the consequent latency) at the end systems and maximizes the goodput of the transport.

Interleaved reliability control protocols can be used with an appropriate rate control protocol to ensure reliable transfer of data while maintaining high throughput, even when there is high loss and/or when there is a large RTT. For example, the rate control protocol can be as simple as sending at a fixed rate, and the interleaved reliability control protocol will guarantee that data is transferred at a rate equal to the fixed rate times the fraction of packets that arrive successfully, while minimizing buffering and latency during the transfer.

As an example of the quantitative improvements offered by the interleaved reliability control protocols introduced here, suppose that the rate control protocol is to send packets at a fixed rate of R packets per second, the round-trip time between a sender and receiver is RTT seconds, and thus N=R*RTT is the number of unacknowledged packets in flight. For the No-code reliability control protocol, the total buffer size at the sender is at least $N*\ln(N)$ and the goodput is approximately 1.0, and there is no possible other trade-off points between the needed amount of buffering and goodput. Here, $\ln(x)$ is defined as the natural logarithm of x. With the TF reliability control protocol, the total buffer size at the sender is at least B and the goodput is approximately B/(B+N), where B is the chosen block size in units of packets and can be chosen to trade-off required buffering against goodput. In contrast, for interleaved reliability control protocols, the total buffer size at the sender is at most B and the goodput is approximately N/(N+X), where X is a positive integer parameter chosen to trade-off the required buffering against goodput, and $B=N*(1+\ln((N/X)+1))$ is the buffer size in units of packets.

As an example, if the rate R is 1,000 packets/second and RTT is one second, then N=1,000 packets. For the No-code reliability control protocol, the buffer size at the sender is at least 7,000 packets. For the TF reliability control protocol, if B is chosen to be 4,000 packets, then the goodput is approximately 0.80. For the interleaved reliability control protocols where X is chosen to be 50, B=4,000 packets (the same value as for the TF reliability control protocol) and the goodput exceeds 0.95, i.e., at most 5% of the received packets are wasted. Thus, in this example the interleaved reliability control protocols require far less buffering than the No-code reliability control protocol with almost the same optimal goodput, and far exceed the goodput of the TF reliability control protocol for the same amount of buffering, i.e., at most 5% wasted transmission for the interleaved reliability control protocols versus 25% for the TF reliability control protocol.

Virtually any rate control protocol can be used with an interleaved reliability control protocol to provide a reliable transport protocol, e.g., send at fixed rate, use a window-based congestion control similar to TCP, use an equation based congestion control protocol such as TCP Friendly Rate Control (TFRC), or use virtually any other rate control protocol.

3. Reliable Transport Protocols

In this description, a reliable transport protocol is a protocol that reliably transfers data from a sender end system to a receiver end system over a packet based network in such a way that all the data is transferred even when there is the possibility that some of the sent packets are not received. FIG. 1 is an illustrative embodiment of a network 130 and set of sender end systems 100(1), . . . , 100(J) and receiver end systems 160(1), . . . , 160(K) on which a reliable transport protocol might operate. Typically, such a protocol also includes some mechanisms for adjusting the packet sending rate, where this sending rate may depend on a variety of factors including the application into which the protocol is built, user input parameters, and network conditions between the sender and receiver end systems.

A reliable transport protocol, such as TCP, typically involves several steps. These steps include ways for end systems to advertise availability of data, to initiate transfer of data to other end systems, to communicate which data is to be transferred, and to perform the reliable transfer of the data. There are a variety of standard ways for end systems to advertise availability, to initiate transfer and to communicate what is to be transferred, e.g., session announcement protocols, session initiation protocols, etc. As these steps are well-known, they need not be described here in great detail.

Reliable transfer of packet data comprises deciding at each point in the transfer what data to send in the packets and at what rate to send the packets. The decisions made at each point in time can depend on feedback sent from the receiver end system and on other factors. Typically, the data is presented at a sender end system as a stream of data, and the reliable transport protocol is meant to reliably deliver this stream to the receiver end system in the same order in which it was sent. Often it is the case that the total length of the stream is not known before the transfer is initiated.

4. Modular Architecture of Reliable Transport Protocols

Adler describes how any reliable transport protocol can be thought of as the combination of a reliability control protocol and a rate control protocol. The reliability control protocol is the portion of the overall transport protocol that decides what data to place in each packet during the transfer. The rate control protocol decides when to send each data packet. In many transport protocols, the reliability control and rate control protocols are inseparably intertwined in operation, i.e., this is the case for TCP. However, it is still the case that even such an intertwined protocol can conceptually be partitioned into a reliability control protocol and a rate control protocol.

Adler advocates the design of reliable transport protocols by designing the reliability control protocol and the rate control protocol independently. The advantage of such an approach is that the same reliability control protocol can be used with a variety of rate control protocols, and thus the same reliability control protocol can be used with the rate control protocol that is appropriate for the application and the network conditions in which the overall reliable transport protocol is used. This modular approach to the design can be quite advantageous, because the same reliability control protocol can be used with a diverse set of rate control protocols in different applications and network environments, thus avoiding a complete redesign of the entire reliable transport protocol for each application and network environment. For example, TCP is used for a variety of applications in different network environments, and it performs poorly for some of these applications and network environments due to the poor throughput it achieves as determined by its rate control protocol. Unfortunately, because the reliability control protocol and the rate control protocol are so intertwined in the TCP architecture, it is not possible to simply use a different rate control protocol within TCP to improve its throughput performance in those situations where it works poorly.

Figure 2:
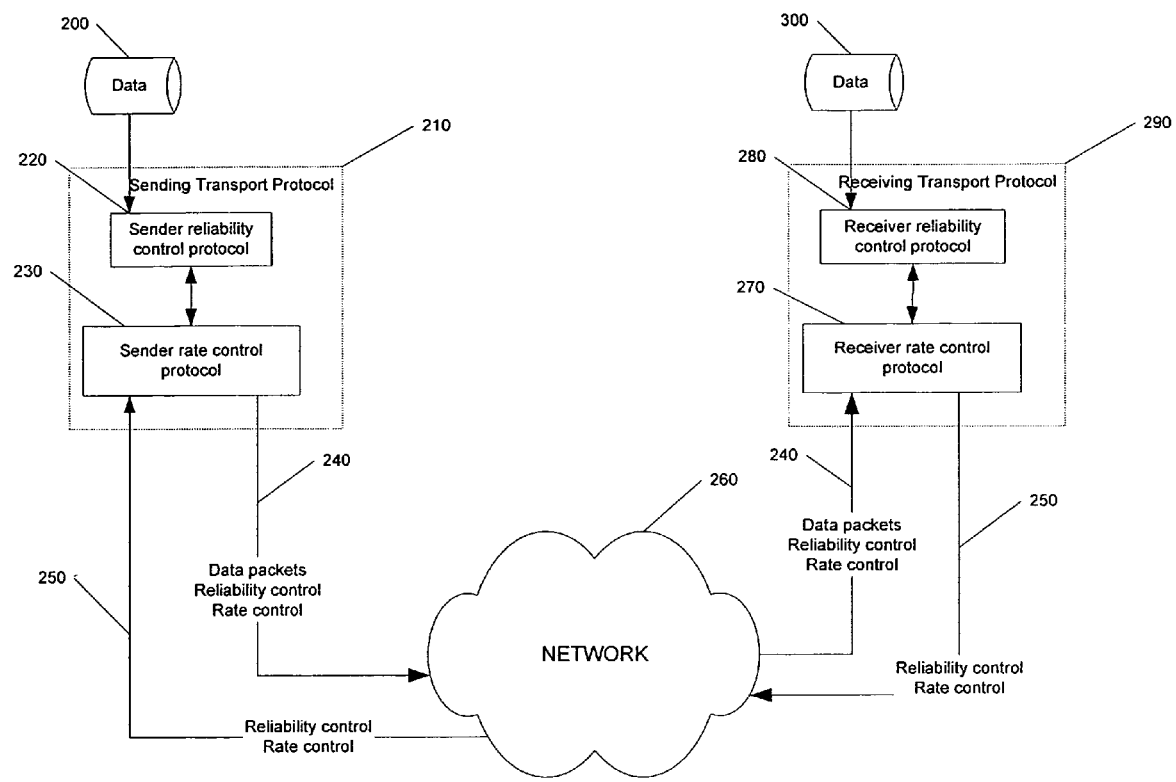
FIG. 2 is an illustration of a modular reliable transport protocol architecture and related system for operating using such protocol.

FIG. 2 is an illustration of the modular reliable transport protocol architecture advocated in Adler. The sender transport protocol 210 is partitioned into the sender reliability control protocol 220 and the sender rate control protocol 230. The sender reliability control protocol 220 determines what is sent in each data packet, and the sender rate control protocol 230 determines when each data packet is sent. The sender reliability control protocol 220 may place additional reliability control information into each data packet that can be used by the receiver reliability control protocol 280 within the receiver transport protocol 290. The sender reliability control protocol 220 may also receive reliability control information 250 from the corresponding receiver reliability control protocol 280 within the receiver transport protocol 290 that is uses to help determine what is sent in each data packet. Similarly, the sender rate control protocol 230 may place additional rate control information into each data packet that can be used by the receiver rate control protocol 270 within the receiver transport protocol 290. The sender rate control protocol 230 may also receive rate control information 250 from the corresponding receiver rate protocol 270 within the receiver transport protocol 290 that is uses to help determine when each data packet is sent.

The reliability control information that is communicated between the sender reliability protocol 220 and the receiver reliability protocol 280 can depend on a variety of factors such as packet loss, and can contain a variety of information as explained later in some detail. Similarly, the rate control information that is communicated between the sender rate control protocol 230 and the receiver rate control protocol 270 can depend on a variety of factors such as packet loss and the measured round-trip time (RTT). Furthermore, the reliability control information and the rate control information may overlap, in the sense that information sent in data packets 240 or in the feedback packets 250 may be used for both reliability control and rate control. Generally, the reliability control and rate control information sent from the sender transport protocol 210 to the receiver transport protocol 290 can be sent with data in data packets 240 or sent in separate control packets 240, or both. These protocols should be designed to minimize the amount of control information that needs to be sent from sender to receiver and from receiver to sender.

For many applications, the data is to be transferred as a stream, i.e., as the data arrives at the sender end system, it is to be reliably transferred as quickly as possible to the receiver end system in the same order as it arrives at the sender end system. For some applications, the latency introduced by the overall transport protocol should be minimized, e.g., for a streaming application, or for an interactive application where small bursts of data are to be transmitted back and forth as quickly as possible between two end systems. Thus, the overall latency introduced by the transport protocol should be minimized.

The sender reliability control protocol 220 and the receiver reliability control protocol 280 typically both require buffers to temporarily store data. Generally, the data that is buffered at the sender reliability control protocol 220 includes at least the earliest data in the stream for which the sender reliability control protocol 220 has not yet received an acknowledgement of recovery from the receiver reliability control protocol 280 up to the latest data in the stream that the sender reliability control protocol 220 has started to send in data packets. The size of the buffer at the receiver reliability control protocol 280 is generally at least the amount of data in the stream from the earliest data not yet recovered up to the latest data for which data packets have been received.

The buffering requirements of the sender reliability control protocol 220 has a direct impact on how much temporary storage space is required by the sender reliability control protocol 220, and how much latency the sender reliability control protocol 220 introduces into the overall reliable data transfer. The buffering requirements of the receiver reliability control protocol 280 have a similar impact. Thus, it is important to minimize the buffering requirements of both the sender reliability control protocol 220 and the receiver reliability control protocol 280.

The reliability control protocol determines what is sent in each data packet. In order to utilize the connection between the end systems efficiently, it is important that the sender reliability control protocol 220 send as little redundant data in packets as possible, in order to ensure that whatever data packets are received at the receiver reliability control protocol 280 are useful in recovering portions of the original data stream. The goodput of the reliability control protocol is defined to be the length of the original stream of data divided by the total length of data packets received by the receiver reliability control protocol 280 during the recovery of the original stream of data. A goodput goal is for the reliability control protocol to result in a goodput of 1.0 or nearly so, in which case the minimum amount of data is received in order to recover the original stream of data. In some reliability control protocols, the goodput may be less than 1.0, in which case some of the transmitted data packets are wasted. Thus, it is important to design reliability control protocols so that the goodput is as close to 1.0 as possible in order to efficiently use the bandwidth consumed by the data packets that travel from the sender end system to the receiver end system.

5. FEC-based Reliability Control Protocols

One solution that has been used in reliability control protocols is that of Forward Error-Correction (FEC) codes, such as Reed-Solomon codes or Tornado codes, or chain reaction codes (which are information additive codes). Original data is partitioned into blocks larger than the payload of a packet and then encoding units are generated from these blocks and send the encoding units in packets. Erasure correcting codes, such as Reed-Solomon or Tornado codes, generate a fixed number of encoding units for a fixed length block. For example, for a block comprising input units, N encoding units might be generated. These N encoding units may comprise the B original input units and N-B redundant units.

Figure 3:
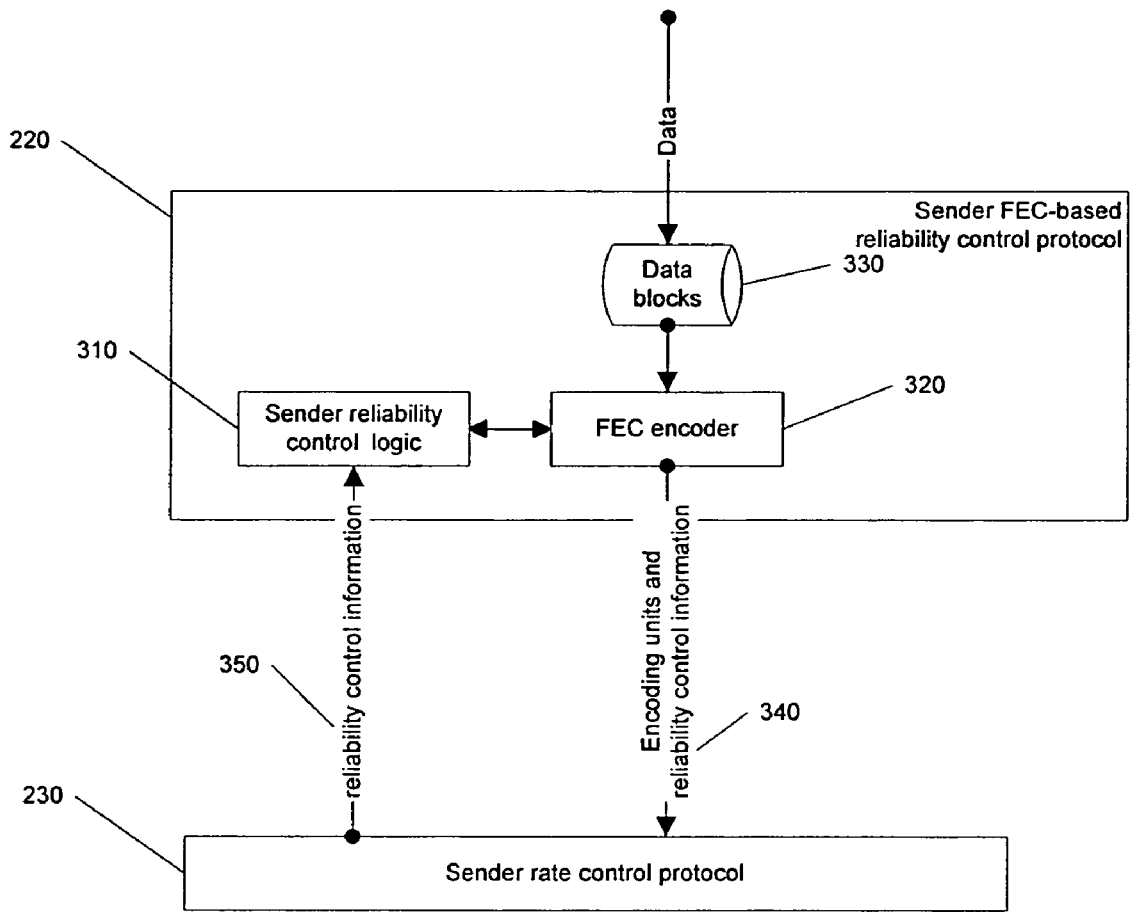
FIG. 3 is an illustrative of a sender FEC-based reliability control protocol architecture and related system for operating using such protocol.
Figure 4:
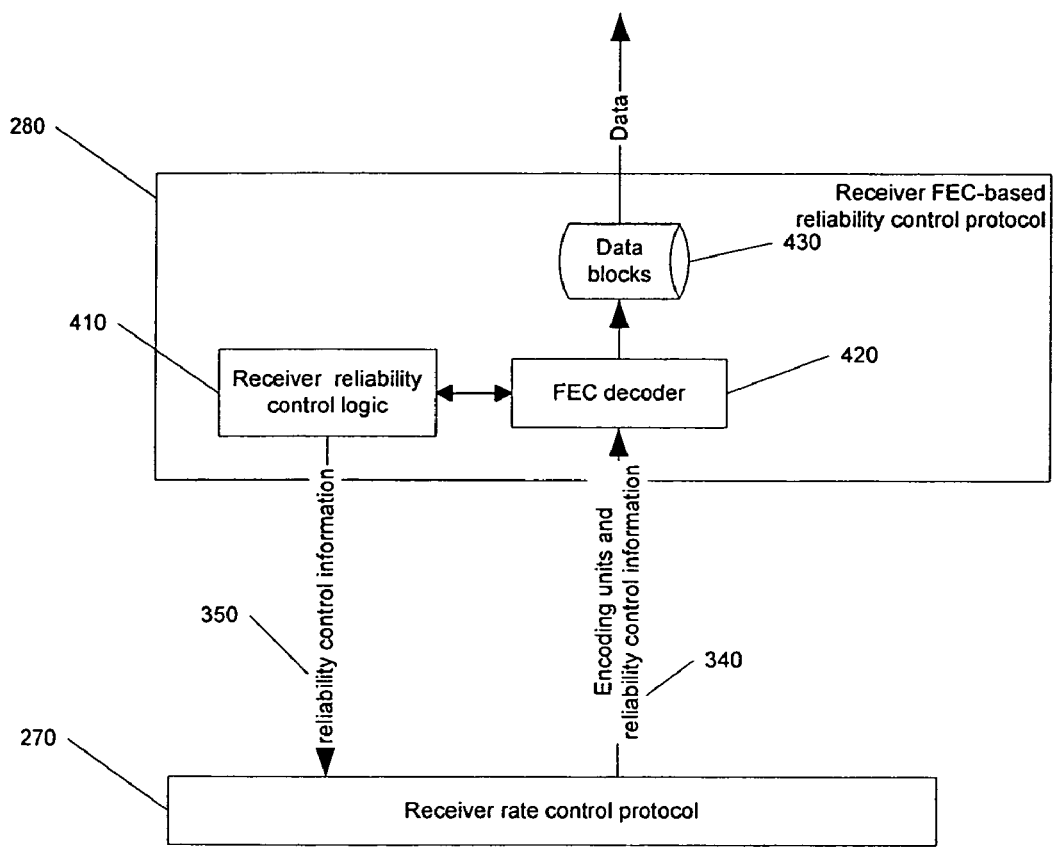
FIG. 4 is an illustrative of a receiver FEC-based reliability control protocol architecture and related system for operating using such protocol.

A FEC-based reliability control protocol is a reliability control protocol that uses FEC codes. FIG. 3 is an illustrative embodiment of a sender FEC-based reliability control protocol 220, and FIG. 4 is an illustrative embodiment of a receiver FEC-based reliability control protocol 280. The sender reliability control logic 310 partitions the original stream of data into data blocks 330, and then instructs the FEC encoder 320 to generate encoding units for each block. The sender reliability control logic 310 determines how encoding units and reliability control information 340 are passed on to a device handling the sender rate control protocol 230, and it also handles the reliability control information 350 that is sent by the receiver FEC-based reliability control logic 410 shown in FIG. 4.

The sender reliability control logic 310 should ensure that enough encoding units are received by the receiver FEC-based reliability control protocol 280 shown in FIG. 4 to ensure that each block is recovered. All blocks may be of essentially the same length, or the block length may vary dynamically during the transfer as a function of a variety of parameters, including the rate at which the stream of data is made available to the sender, the sending rate of the data packets, network conditions, application requirements and user requirements.

Suppose a given block of data is B encoding units in length. For some FEC codes the number of encoding units required to recover the original block of data is exactly B, whereas for other FEC codes the number of encoding units required to recover the original block of data is slightly larger than B. To simplify the description of the FEC-based reliability control protocols, it is assumed that B encoding units are sufficient for the recovery of the data block, where it is to be understood that a FEC code that requires more than B encoding units in order to decode a block can be used with a slightly decreased goodput and a slightly increased buffering requirement.

The receiver reliability control logic 410 in FIG. 4 is responsible for ensuring that B encoding units are received in order to decode the data block, and then the FEC decoder 420 is used to recover the data block 430. The receiver reliability control logic 410 is responsible for receiving the encoding units and reliability control information 340 sent from the sender FEC-based reliability control protocol 220, and for generating and sending reliability control information 350 that is eventually sent to and processed by the sender reliability control logic 310.

6. TF Reliability Control Protocol

The TF reliability control protocol partitions the stream of data into generally equal size blocks. The overall architecture is that there is one active data block at any point in time, and the sender generates and sends encoding units for that data block until it receives a message from the receiver indicating that enough encoding units have arrived to reconstruct the block, at which point the sender moves on to the next block. Thus, all encoding units for a given block are generated and sent and the block is recovered before any encoding units for the subsequent block are generated and sent.

Figure 5:
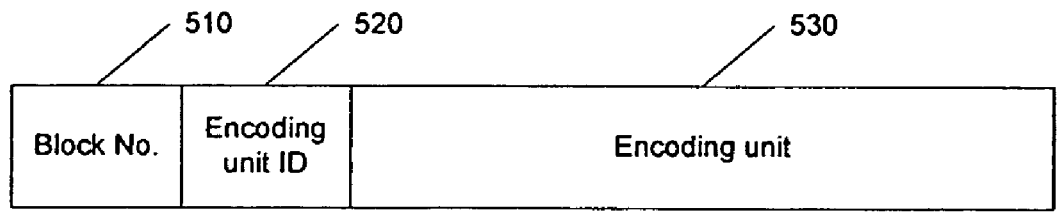
FIG. 5 shows one possible set of formats that could be used by a system implementing a TF reliability control protocol.
Figure 5:
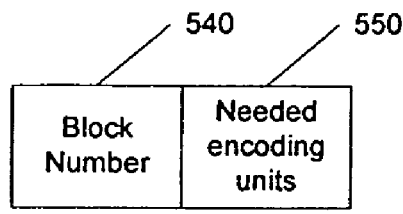

FIG. 5 shows one possible set of formats that could be used by a TF reliability control protocol. The sender data format describes the format in which the sender TF reliability control protocol sends encoding units and the corresponding reliability control information to the receiver TF reliability control protocol. This includes the Block number 510 which indicates which block the encoding unit is generated from, the encoding unit ID 520 which indicates how the encoding unit is generated from the block, and the encoding unit 530 which can be used by the FEC decoder within the receiver TF reliability control protocol to recover the block. The receiver feedback format describes the format in which the receiver TF reliability control protocol sends reliability control information to the sender TF reliability control protocol. This includes the Block number 540, which is the block number of the current block the receiver TF reliability control protocol is receiving encoding units for to recover the block, and Needed encoding units 550 which is the number of additional encoding units the receiver TF reliability control protocol needs to recover the block.

Figure 6:
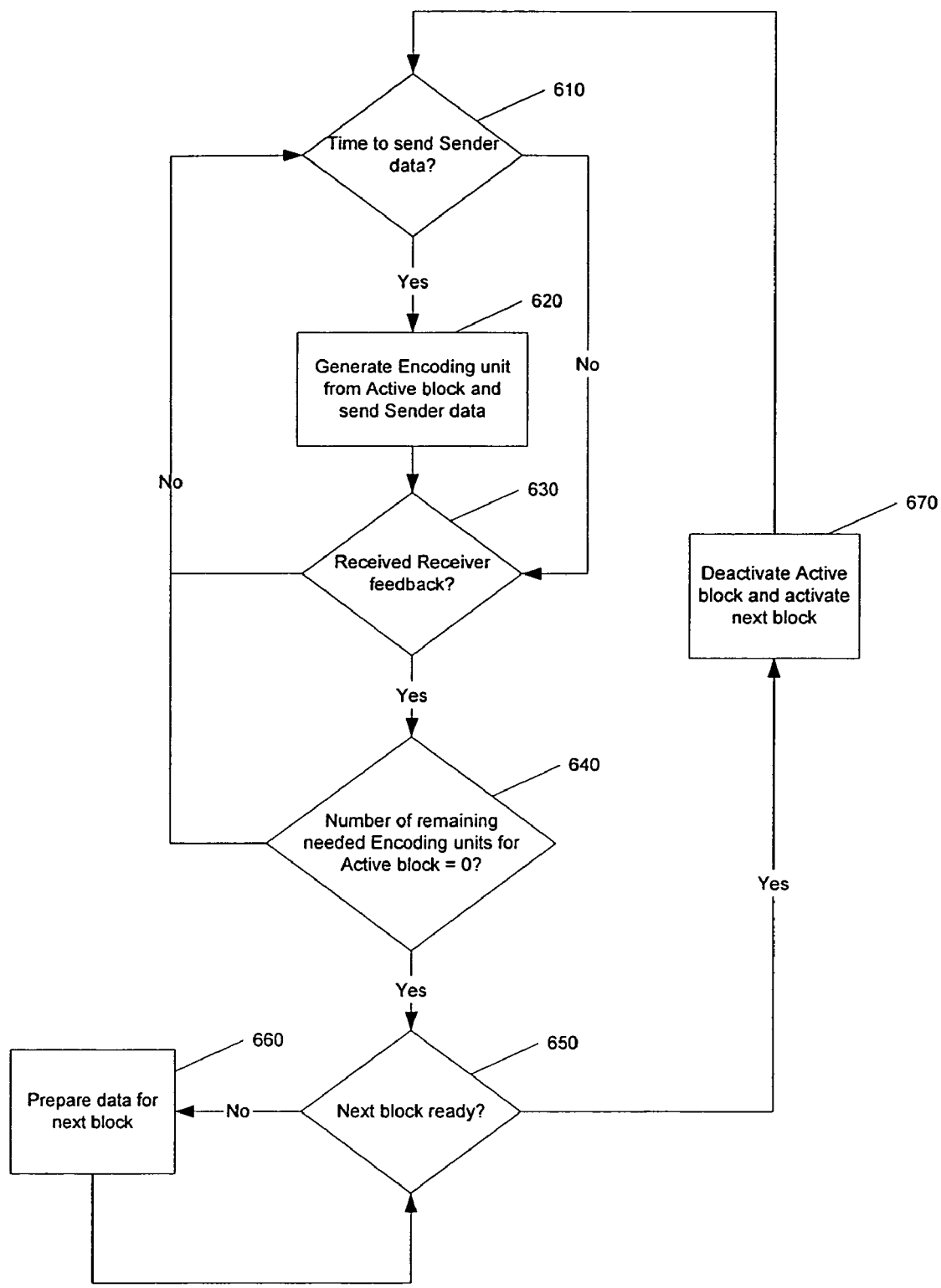
FIG. 6 is a block diagram of logic of a system implementing a sender TF reliability control protocol.

FIG. 6 is an illustrative embodiment of a process for implementing a sender TF reliability control protocol. The process continually checks to see if it is time to send sender data (step 610), which is determined by the corresponding sender rate control protocol. If it is time to send sender data, then an encoding unit is generated from the active block and the sender data is sent (620). An example of a form for the sender data is the format shown in FIG. 5. The process also continually checks to see if receiver feedback has been received 630. An example of a form for the receiver feedback data is the format shown in FIG. 5. If there is receiver feedback, then it is processed to update the information on how many additional encoding units the receiver needs to recover the active block. It then checks to see if the number of encoding units needed is zero 640, and if it is, then it sees if the next block in the stream of data is available 650. If it is not available, it prepares the next block 660 until it is ready, and then goes on to deactivate the current active block and activate the next block 670. In general, the next block may be being prepared while the current active block is being transmitted.

It should be understood that each of the protocols described herein could be implemented by a device or software or firmware executed by a suitable processor. For example, implementations could be made using network devices such as routers and host computers, as well as being implemented on wireless transmitters, retransmitters, and other wireless devices. The protocols described herein can be implemented in software, has methods, and/or has apparatus configured to implement such protocols.

Figure 7:
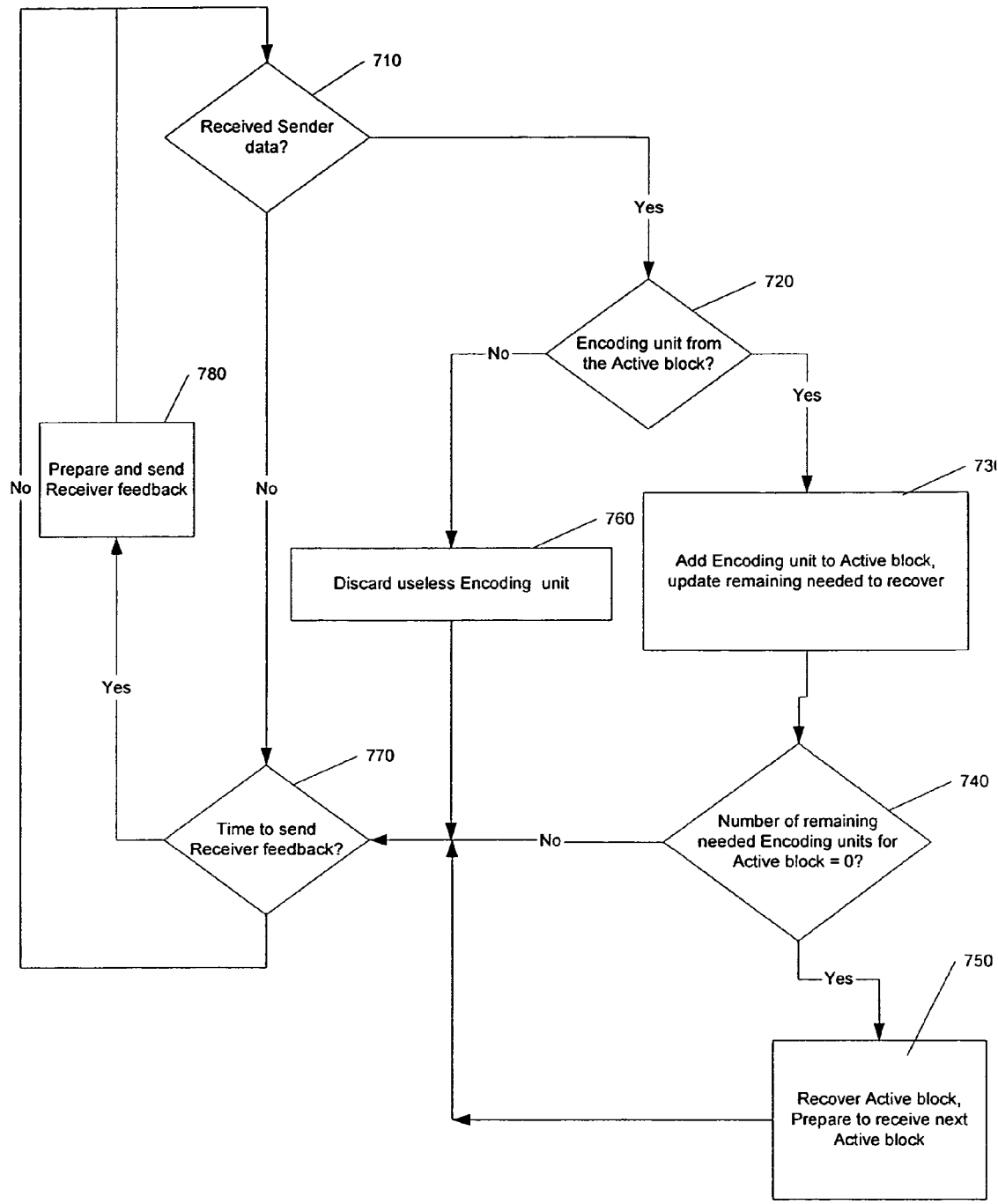
FIG. 7 is a block diagram of logic of a system implementing a receiver TF reliability control protocol.

FIG. 7 is an illustrative embodiment of a process for implementing a receiver TF reliability control protocol. The receiver TF reliability control protocol continually checks to see if sender data has been received 710, which is in the sender data format shown in FIG. 5. If so, then it is checked if the encoding unit within the sender data is from the active block 720. If the encoding unit is not from the active block then it is discarded 760, and thus this is wasted sender data since it is not useful in recovering any block. If the encoding unit is from the active block then it is added to the set of encoding units already received for the active block and the needed number of encoding units for the block is decremented by one 730. It then checks to see if the needed number of encoding units is zero 740, and if it is then it recovers the active block using the FEC decoder and prepares for reception of encoding units for the next active block 750. The receiver TF reliability control protocol also continually checks to see if it is time to send receiver feedback 770, which is determined by the corresponding receiver rate control protocol. If it is time then receiver feedback is prepared and sent 780, which is in the format of the receiver feedback format shown in FIG. 5.

Note that this is a partial description of the overall TF reliability control protocol. For example, it does not specify the conditions under which receiver feedback is sent by the receiver TF reliability control protocol. This can be triggered by reception of received sender data, by a timer that goes off every so often, or by any combination of these events or any other events as determined by the receiver rate control protocol. Generally, receiver feedback is sent often enough to keep the sender TF reliability control protocol informed on a regular basis about the progress of reception of encoding units at the receiver TF reliability control protocol, and yet not so often as to consume nearly as much bandwidth as the sender data containing the encoding units sent from the sender TF reliability control protocol to the receiver TF reliability control protocol.

Note that the TF reliability control protocol can be considered "wasteful" in the following sense. Let B be the size of each data block in units of encoding units, let R be the rate at which packets are sent by the rate control protocol, and let RTT be the round-trip time between the sender and receiver end systems and let N=R*RTT. Suppose there is no packet loss between the sender and receiver. Then, after the sender TF reliability control protocol has sent B encoding units for an active block (which is enough to recover the block), it continues to send N additional encoding units until it receives receiver feedback from the receiver TF reliability control protocol indicating that enough encoding units have arrived to recover the block, and all of these N encoding units are wasted. To recover a block of length B requires sending B+N encoding units, and thus the goodput is B/(B+N). If B is relatively small in comparison to N, then the goodput is far from optimal, and a lot of the used bandwidth between the sender and receiver is wasted. On the other hand, if B is large in comparison to N, then the size of the buffers in the sender and receiver TF reliability control protocols can be large, and this also implies that the latency in the delivery of the data stream at the receiver is large. As an example, suppose the size of an encoding unit is 1 kilobyte, the rate R is 1,000 encoding units per second=1 megabyte per second=8 megabits per second, and RTT is one second. Then N=R*RTT=1 megabyte. If the size of a block is set to B=3 megabytes, then the goodput is only approximately (B/(B+N))=0.75, i.e., around 25% of the sent encoding units are wasted. To increase the goodput to, for example, 0.98 so that only around 2% of the sent encoding units are wasted requires a very large buffer size of B=49 megabytes. This size buffer then leads to a latency added by the reliability control protocol of at least 50 seconds.

There are many variants on the TF reliability control protocol described above. For example, the sender TF reliability control protocol could stop sending encoding units after B encoding units have been sent from a block and wait to receive receiver feedback to indicate whether or not enough encoding units have been received to recover the block. If there is no loss then this variant will not send any encoding units that will be wasted, but even in this case there is a gap of RTT time between each block, and if the bandwidth is not being used for any other purpose, this protocol still leads to a wasted amount of bandwidth of R*RTT. Furthermore, the total delivery time will be slower by a factor of B/(B+N) than is ideal. If there is loss, then this variant will add even further latencies and slow downs in delivery, because eventually additional encoding units will have to be sent to recover the block in place of the lost encoding units.

7. Interleaved Reliability Control Protocols

The TF reliability control protocol has an advantage over the No-Code reliability control protocol because any lost encoding unit can be compensated for by any subsequently received encoding unit generated from the same block without need for receiver feedback. The primary reason that the TF reliability control protocol is wasteful is because of the sequential nature of the protocol, in the sense that the transfer of each block is completed before the transfer for the next block begins. The improved reliability control protocols described herein can be used to interleave the processing of the blocks in an intelligent fashion.

Figure 8:
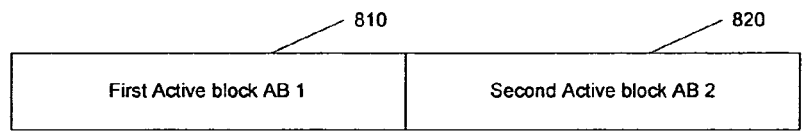
FIG. 8 is an illustration of active blocks.
Figure 8:
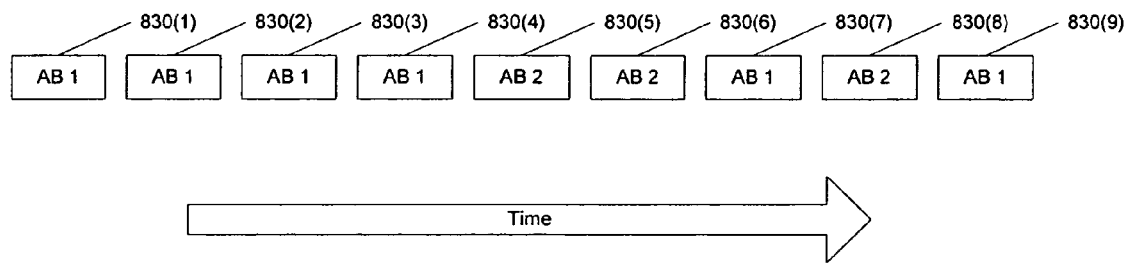

An illustrative example of interleaving is shown in FIG. 8. In this example, there are two active blocks, the first active block AB 1 (810) and the second active block AB 2 (820). The lower part of FIG. 8 shows an example of a pattern of data packet sending over time, where each packet is labeled by either AB 1 or AB 2 depending on whether the corresponding packet contains an encoding unit for AB 1 or AB 2. In this example, four packets containing encoding units for AB 1 (830(1), 830(2), 830(3) and 830(4)) are sent first, then two packets containing encoding units for AB 2 (830(5) and 830(6)), followed by one packet contain an encoding unit for AB 1 (830(7)), one packet containing an encoding unit for AB 2 (830(8)) and one packet containing an encoding unit for AB 1 (830(9)). In general, the interleaving between encoding units for different blocks should be designed to maximize goodput and to minimize the total buffering requirements (and the consequent introduced latency).

Figure 9:
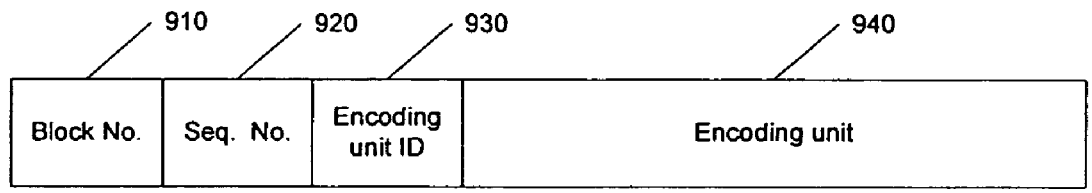
FIG. 9 is illustration of a possible set of formats that could be used by an interleaved reliability control protocol.
Figure 9:
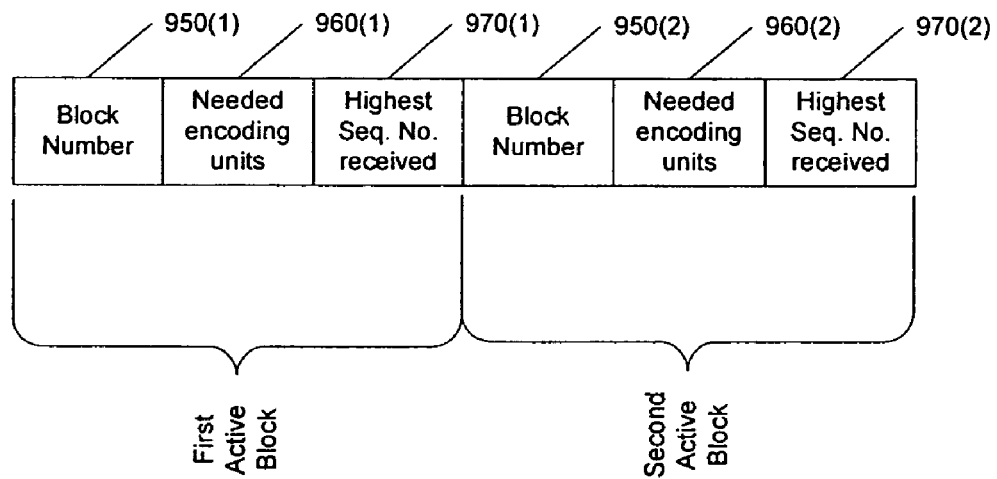

FIG. 9 shows one possible set of formats that could be used by an interleaved reliability control protocol. The sender data format describes a format in which the sender interleaved reliability control protocol could send encoding units and the corresponding reliability control information to a receiver interleaved reliability control protocol. This example includes a Block number 910 which indicates which block the encoding unit is generated from, a Sequence number 920 which indicates how many encoding units have been sent from this block, an encoding unit ID 930 which indicates how the encoding unit is generated from the block, and an encoding unit 940 which can be used by the FEC decoder within the receiver interleaved reliability control protocol to recover the block. The receiver feedback format describes a format in which the receiver interleaved reliability control protocol could send reliability control information to the sender interleaved reliability control protocol. For each of the active blocks, this includes a Block number (950(1), 950(2)), how many additional encoding units are needed to recover the block (960(1), 960(2)) and the highest sequence number received so far from that block (970(1), 970(2)).

Figure 10:
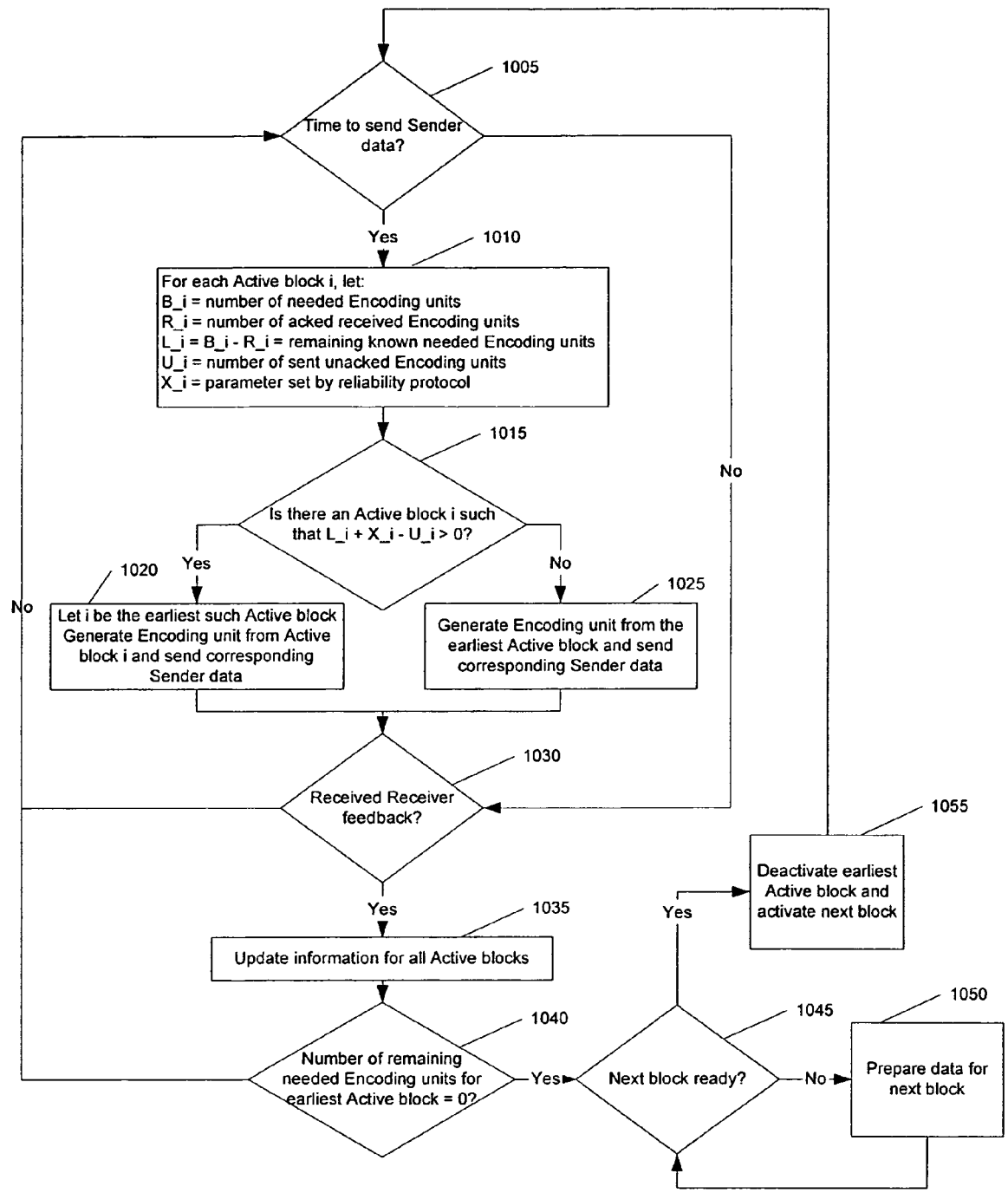
FIG. 10 is an illustrative embodiment of the logic of a system implementing a basic sender interleaved reliability control protocol.

FIG. 10 is an illustrative embodiment of the logic of a Basic sender interleaved reliability control protocol. In this version of the protocol, the Basic sender interleaved reliability control protocol continually checks to see if it is time to send sender data 1005, which is determined by the corresponding sender rate control protocol. If it is time to send sender data then the Basic sender interleaved reliability control protocol uses the following set of rules to determine from which active block to generate and send an encoding unit.

The Basic sender interleaved reliability control protocol keeps track of the following variables for each active block i (1010): $B\_i$ is the number of encoding units needed to recover that block; $R\_i$ be the number of encoding units that the Basic sender interleaved reliability control protocol knows that the Basic receiver interleaved reliability control protocol has received from that block based on received receiver feedback; $L\_i=B\_i-R\_i$ is the remaining number of unconfirmed encoding units that the Basic sender interleaved reliability control protocol knows that the Basic receiver interleaved reliability control protocol needs to receive to recover the block; $U\_i$ is the number of encoding units sent for the block but for which an acknowledgement has not yet been received by the Basic sender interleaved reliability control protocol; $X\_i$ is a parameter that determines how aggressively the Basic sender interleaved reliability control protocol will send encoding units for the block.

These variables can be determined as follows: The value of $B\_i$ is determined by the size of the block and the size of each encoding unit. Generally, each encoding unit is of the same size and the size is chosen to be suitable for the payload of a data packet, e.g., the length of an encoding unit could be 1024 bytes. The size of each block may be generally the same or it may vary, or it may depend on the arrival rate of the data stream at the sender, or it may depend on the sending rate of data packets, or it may depend on a combination of these and other factors. The value of $R\_i$ is determined based on receiver feedback received in step 1030. The value of $U\_i$ is the difference between the Sequence number in the last sender data sent containing an encoding unit for the block and the Highest Sequence number received in a receiver feedback for the block.

The value of $X\_i$ is a function of the overall reliability control protocol, and as is explained later there are tradeoffs in the choice of $X\_i$. The value of $X\_i$ could remain constant during the sending of all encoding units for the block, or it could change value in a variety of different ways, some of which are explained later. Essentially, $X\_i$ at each point in time is a measure of how many additional encoding units the Basic sender interleaved reliability control protocol is willing to send beyond the minimal needed to recover the block without any additional receiver feedback from the Basic receiver interleaved reliability protocol. Since $L\_i$ is the number of encoding units needed to recover block i beyond the already acknowledged received encoding units, and since $U\_i$ is the number of encoding units for block i that are in flight and not yet acknowledged, then $L\_i+X\_i-U\_i$ is the number of additional encoding units for block i that the Basic sender interleaved reliability control protocol is willing to send at this point in time. The tradeoff on the value of $X\_i$ is the following. As $X\_i$ increases the goodput decreases, since possibly up to $X\_i$ encoding units beyond the minimal needed to recover active block i could be received by the Basic receiver interleaved reliability control protocol. On the other hand the total size of active blocks decreases as $X\_i$ increases, because the number of packet time slots to complete the reliable reception of active block i decreases as $X\_i$ increases. This is because $X\_i$ encoding units for block i can be lost and still the Basic receiver is able to recover the block without waiting for receiver feedback to trigger transmission of additional encoding units. It turns out that the tradeoffs between total buffer size and goodput as a function of $X\_i$ are much more favorable than the corresponding tradeoffs for other reliability control protocols such as the TF reliability control protocol or the No-code reliability control protocol.

In step 1015, a test is made to determine if there is an active block i that satisfies the inequality $L\_i+X\_i-U\_i>0$. The value of $L\_i$ is how many encoding units the receiver would need to recover the block based on encoding units already acknowledged by receiver feedback. $U\_i$ is the number of unacknowledged encoding units in flight for this block and thus $L\_i-U\_i$ is the number of additional encoding units that will have to be sent if all encoding units in flight are not lost, and thus if this number is zero or smaller than the receiver will be able to recover the block if all the encoding units in flight for the block arrive. On the other hand, some of the encoding units might be lost, and $X\_i$ is the number of additional encoding units that the sender is willing to send proactively to protect against losses to avoid having to transmit additional encoding units for the block triggered by subsequent receiver feedback. Thus, if $L\_i+X\_i-U\_i>0$ then the sender is willing to send more encoding units for block i, and if it is zero or negative then the sender is not willing to send more encoding units for block i. Thus, if in step 1015 there is an active block i that satisfies $L\_i+X\_i-U\_i>0$, an encoding unit is generated and corresponding sender data is sent for the earliest such active block in step 1020. If there is no such active block then an encoding unit is generated and corresponding sender data is sent from the earliest active block among all active blocks in step 1025. Preferably, the parameters are set in such a way as to avoid as much as possible having no block satisfy the condition in step 1015 which forces the execution of step 1025, because essentially step 1025 should be done as a last resort to clear out the buffers within the Basic sender interleaved reliability control protocol.

One variant of the protocol is the following. The number of Activated blocks starts at one, i.e., the first block of the data stream is activated. Only when there is no active block that satisfies the condition in step 1015 is a new block in the stream of data is activated. Using this simple strategy, blocks only become active blocks when needed, and thus the number of active blocks, and consequently the buffer size, self-adjusts to the number needed to guarantee a goodput $B\_i/(B\_i+X\_i)$ for block i.

Another variant of the protocol is the following. In this variant the total buffer size always remains the same size (if all blocks are the same size this means there is always fixed number of active blocks), whereas the goodput may vary. Whenever there is no active block that satisfies the condition in step 1015 then the values of the $X\_i$ for the active blocks is increased until there is an active block that satisfies the condition in step 1015. Whenever it is appropriate the values of $X\_i$ for active block i is reduced, with the constraint that there is always an active block that satisfies the condition in step 1015. There are many possible ways to increase and decrease the values of the $X\_i$, e.g., increase all values equally, increase all values proportionally equally, increase the values for the first active blocks more than the values for the last active blocks, increase the values for the last active blocks more than the values for the first active blocks. Similar strategies can be used to decrease the values of the $X\_i$. One skilled in the art can think of many other variations as well.

There are many other combinations and extensions of these variants of the protocol that are too numerous to describe, but should be obvious to one skilled in the art.

In step 1030 it is checked to see if any receiver feedback has been received, and if so all of the parameters are updated based on this in step 1035, i.e., the parameters $R\_i$, $U\_i$ and $X\_i$ for all active blocks i. In step 1040 it is checked to see if the earliest active block has been acknowledged as fully recovered, and if so then the next block is prepared in steps 1045 and 1050 and the earliest active block is deactivated and the next block is activated in step 1055. In general, the next block or several next blocks may be in preparation while the current active block is being transmitted, and ready to be activated at or before the time the earliest active block is to be deactivated.

Figure 11:
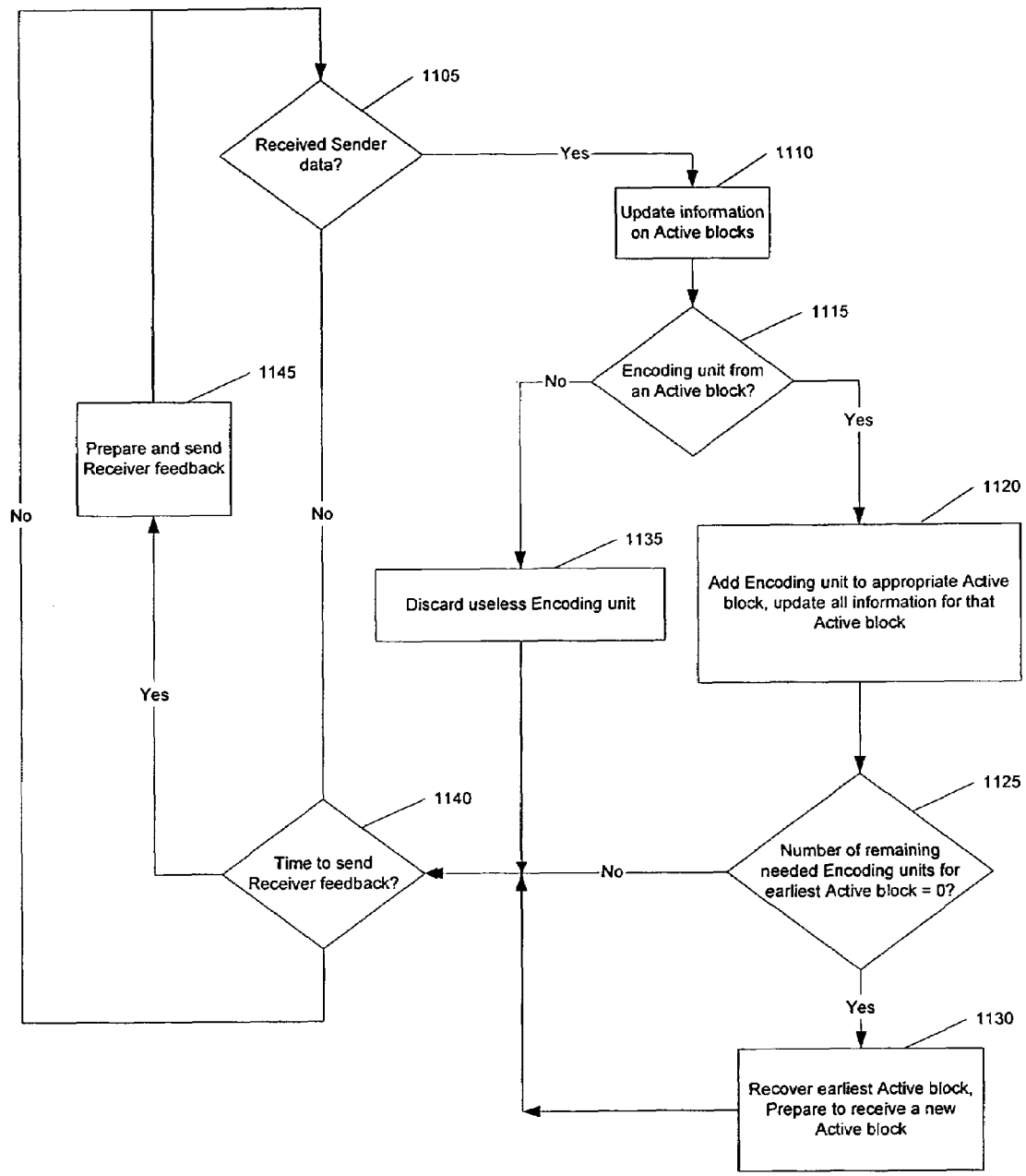
FIG. 11 is an illustrative embodiment of the logic of a system implementing a basic receiver interleaved reliability control protocol.

FIG. 11 is an illustrative embodiment of the logic of the Basic receiver interleaved reliability control protocol. In this version of the protocol, the Basic receiver interleaved reliability control protocol continually checks to see if sender data has been received 1105, which for example could be in the sender data format shown in FIG. 9. If so, it updates its information on all active blocks in step 1110 and checks to see if the received encoding unit within the sender data is from an active block 1115. If the encoding unit is from a block that is already recovered or from a block that is too far forward in the data stream to be a current active block then it is discarded in step 1135, and thus this is wasted sender data since it is not useful in recovering any block. Otherwise the encoding unit is added to the pool of encoding units for the active block from which it was generated and how many encoding units are needed to recover the active block is updated in step 1120.

The number of needed encoding units for block i is calculated as $B\_i$ minus the number of received encoding units. There are a variety of ways of communicating the value of $B\_i$ to the Basic receiver interleaved reliability control protocol, e.g., the value of $B\_i$ could be included within each sender data, the value of $B\_i$ could be sent in separate control messages, the value of $B\_i$ could be the same for all blocks and communicated during session initiation, etc.

It is then checked to see if the needed number of encoding units for the earliest active block is zero in step 1125, and if it is then it recovers the active block using the FEC decoder and prepares for reception of encoding units for a new next active block in step 1130. The Basic receiver interleaved reliability control protocol also continually checks to see if it is time to send receiver feedback 1140, which is determined by the corresponding receiver rate control protocol. If it is time then receiver feedback is prepared and sent in step 1145, which for example could be in the sender data format shown in FIG. 9.

Note that the above is a partial description of an overall Basic interleaved reliability control protocol. For example, it does not specify the conditions under which receiver feedback is sent by the Basic receiver interleaved reliability control protocol. This can be triggered by reception of received sender data, by a timer that goes off every so often, or by any combination of these events or any other events as determined by the receiver rate control protocol. Generally, receiver feedback is sent often enough to keep the Basic sender interleaved reliability control protocol informed on a regular basis about the progress of reception of encoding units at the Basic receiver interleaved reliability control protocol, and yet not so often as to consume nearly as much bandwidth as the sender data containing the encoding units sent from the Basic sender interleaved reliability control protocol to the Basic receiver interleaved reliability control protocol.

The Basic interleaved reliability control protocol can have a much better tradeoff between goodput and the size of the buffers than the TF reliability control protocol or the No-code reliability control protocol. For example, suppose that there are at most two active blocks for the Basic interleaved reliability control protocol. Let B be the size of each data block in units of encoding units, let R be the rate at which packets are sent by the rate control protocol, and let RTT be the round-trip time between the sender and receiver end systems and let $N=R*RTT$, and suppose X is a fixed constant for all active blocks. In this example, assume that all of these parameters have fixed values, although in general they may vary dynamically during the data transfer, and assume that $B>=N$.

Suppose there is no packet loss between the sender and receiver. Then, the Basic sender interleaved reliability control protocol sends $B+X$ encoding units for the earliest active block and then sends encoding units from the next active block until it receives receiver feedback that indicates the earliest active block has been recovered successfully by the Basic receiver interleaved reliability control protocol. At this point the Basic sender interleaved reliability control protocol deactivates the earliest active block, the next active block for which some encoding units have already been sent becomes the earliest active block, and the next block is activated to become an active block. Thus, $B+X$ encoding units are used to recover a block of length B, and thus X of the sent encoding units are wasted. On the other hand, if $B>=N$ then there will always be an active block that satisfied the inequality shown in step 1015 of FIG. 9. Thus, the goodput is $B/(B+X)$, whereas the total size of the buffer is $2*B$ if there are two active blocks. As an example, suppose the size of an encoding unit is 1 kilobyte, the rate R is 1,000 encoding units per second=1 megabyte per second=8 megabits per second, and RTT is one second. Then $N=R*RTT=1$ megabyte. If the size of a block is set to $B=1$ megabyte and X is set to 10 then the goodput is approximately $(B/(B+X))=0.99$, i.e., at most 1% of the sent encoding units are wasted, whereas the total buffer size is only 2 MB, which means that the Basic sender interleaved reliability control protocol adds around 2 seconds of latency in this example. Note that this buffer size is smaller by a factor of 25 than that of the sender TF reliability control protocol in the same situation.

In the example described above where there is no packet loss, the value of X could be set to zero, increasing the goodput up to 1.0. However, when there is any packet loss it turns out that setting $X>0$ can have significant advantages. For example, if at most 10 encoding units are lost out of each 1,000 sent in the above example, then an analysis shows that the same goodput and buffer sizes is achieved with $X=10$, whereas this would not be necessarily true with $X=0$. When packet loss is more variable and unknown, and in particular when the number of packets lost per B packets can be more than X, it still turns out that goodput and buffer sizes that can be achieved by the Basic interleaved reliability control protocol are quite good and quantifiably better than what can be achieved using the TF reliability control protocol or the No-code reliability protocol.

As another example, suppose the sending rate R in packets per second and the round-trip time RTT remains constant, and $N=R*RTT$. Suppose packet loss is random such that each packet is lost with probability p. Further suppose that each block i is of size $B\_i$ is the same size C in units of packets, and that each $X\_i$ is the same value Y. Further suppose that the variant of the protocol described above that only activates a new block when needed is used. Consider a block from the time it is first activated till the time it is deactivated because an acknowledgement that it has been recovered is received from the receiver. At some time t when $C-N$ packets of the block have been acknowledged there are $F=N+Y$ packets in flight that are unacknowledged and the sender knows that the receiver needs $N=F-Y$ of these packets to complete the block. At time $t+RTT$, of the F packets that were in flight for the block at time t, $(1-p)*F$ of the packets have been received by the receiver and the sender has received an acknowledgement. Thus, at time $t+RTT$ the sender knows that the number of remaining packets that the receiver needs is now $N-(1-p)*F=p*F-Y$ and thus the number of packets in flight is now $p*F$. Continuing the logic, at time $t+i*RTT$ the sender knows that the number of remaining packet that the receiver needs is $p^i*F-Y$ and thus the number of packets in flight is $p^i*F$. When the number of packets that the sender knows the receiver needs goes below zero then the block is completed, and this is true at time $t+i*RTT$ when i satisfies $p^i*F-Y<=0$. The smallest value of i when this inequality is true is when i is approximately $\ln((N/Y)+1)/\ln(1/p)$. Since in each RTT approximately $(1-p)*N$ packets are received by the receiver, this means that the farthest the sender protocol could have proceeded in the data stream beyond the block in consideration by the time the block is acknowledged as received is at most $(\ln((N/Y)+1)/\ln(1/p))*(1-p)*N$ packets. Noting that $(1-p)/\ln(1/p)<=1$ for all values of p, this means that the size of the buffer is at most $C+\ln((N/Y)+1)*N$ packets in length. Of course, this is all assuming that the random process behaves exactly as its expected behavior, but this does give a rough idea of how the protocol behaves, at least as Y is not too small. In this case, the goodput is C/(C+Y). Thus, for example, if RTT=1, R=1,000, C=1,000, Y=50, the buffer size is around at most 4,000 and the goodput is 0.95.

There are many variants on the Basic interleaved reliability control protocol described above that should be apparent after reading this description. For example, as described above, the sender reliability control protocol could use more than two active blocks at a time, and this has the potential advantage of being able to reduce the overall size of the buffers used at the sender and receiver reliability control protocols at the expense of more complexity in managing more active blocks.

As another example of a variant, it can be beneficial to use a random process to determine from which active block an encoding unit is to be sent. This is because packet loss patterns can be systemic and are not necessarily random, and thus for any deterministic procedure used to select which encoding unit to send next there is packet loss pattern such that some blocks are never recovered but still packets are delivered to the receiver. For example, consider the loss pattern where whenever the deterministic procedure sends an encoding unit from a particular active block then that encoding unit is lost, but whenever it sends an encoding unit for any other active block then that encoding unit arrives at the receiver. Then, in this example the receiver never recovers the active block even though the receiver still receives encoding units. To overcome this type of systematic loss, it is advantageous for the sender reliability control protocol to randomize from which active block to send the next encoding unit. One simple way to achieve this is for the sender reliability control protocol to buffer together batches of Q encoding units to be sent, and then send each batch of Q encoding units in a random order. More sophisticated methods may also be used, e.g., for each encoding unit to be sent, assign a dynamically changing probability that it is sent the next time an encoding unit is to be sent, where the probability increases the more times it is not selected. Another variant is to modify step 1020 as shown in FIG. 10 of the Basic sender interleaved reliability control protocol so that the encoding unit sent is randomly generated (using an appropriately chosen probability distribution that may favor earlier active blocks and that may vary dynamically over time) from among the active blocks that satisfy the condition in step 1015.

If the parameter $X\_i$ is used to determine when to send an encoding unit for active block i, there are many variants on how to adjust $X\_i$ during the transmission. One example is to fix $X\_i$ to a value and maintain that value throughout the transmission. For example, $X\_i$ could be set to zero, or to some other fixed value like 10. Another example is to fix $X\_i$ to a value at the beginning of the transmission of encoding units from active block i, and then $X\_i$ is incremented every time an encoding unit is to be sent and the condition for sending an encoding unit from active block i is not met. There are many variants on how $X\_i$ can be incremented. As an example, $X\_i$ could be incremented by zero the first N such times, and incremented by N/B each subsequent time. It is also possible that at some steps the increment of $X\_i$ could be negative.

As other variants, instead of only using the parameter $X\_i$ for each active block i as described in the Basic interleaved reliability control protocol, one could use other ways of determining whether or not an encoding unit should be sent from a particular active block. For example, an average of the packet loss probability could be maintained, and then the number of encoding units allowed to be sent from an active block could be determined based on the assumption that the recent packet loss probability is a good predictor for the current packet loss probability. For example, if the average loss probability is currently p, then one strategy is to modify step 1015 as shown in FIG. 10 of the Basic sender interleaved reliability control protocol so that the condition is $L\_i+X\_i/(1-p)-U\_i*(1-p)>0$. The rationale behind this particular choice is that if $U\_i$ encoding units are in flight for active block i, only a fraction 1-p of them will arrive at the Basic receiver interleaved reliability control protocol, and if $X\_i/(1-p)$ additional packets are sent then $X\_i$ will arrive at the Basic receiver interleaved reliability control protocol. Thus, overall on average the Basic receiver interleaved reliability control protocol will receive $B\_i+X\_i$ encoding units for active block i, and the value of $X\_i$ additional encoding units can be set to be enough to take into account variability in the packet loss rate to avoid depending on receiver feedback for the transmission of a sufficient number of encoding units to recover the block.

Other variants of the interleaved reliability control protocol take into account the possibility that packets may not arrive in the same order at the receiver as the sending order. Thus, subsequent receiver feedback from the receiver may for example report back a larger number of received encoding units for a given active block than previous receiver feedback, even though the highest sequence number received from the block is the same. Thus, the logic in the Basic interleaved reliability control protocol can be modified in both the sender and receiver to accommodate accounting for reordered packets.

As described earlier, step 1025 of the Basic sender interleaved reliability control protocol as shown in FIG. 10 is generally to be avoided by setting the parameters appropriately so that at least one active block satisfies condition 1015 at each point in time. A variant on step 1025 is to vary which active block is chosen from which to generate and send an encoding unit. For example, an active block can be chosen randomly in step 1025, or the choice could cycle through the set of active blocks.

Step 1045 of FIG. 10 indicates that the next block is immediately activated as soon as the earliest active block is deactivated. A variant that can save on the total buffer size and the consequent latency is to only activate a next block when it is time to send an encoding unit from a block that is beyond the latest current active block.

The Basic interleaved reliability control protocol as described above implicitly assumes that the number of active blocks at any point in time is fixed. A variant is to allow the number of active blocks to vary depending on a variety of factors, including at what rate data is made available for transmission, how much packet loss is occurring, variability in the sending rate of packets, etc. For example, under low packet loss conditions and low sending rate conditions the number of active blocks may be kept small, but as the loss conditions become worse or the sending rate increases the number of active blocks may be allowed to temporarily grow. Thus, buffering and latency vary dynamically depending on the conditions in which the protocol is operating.

The aggregate size of active blocks may also be allowed to vary even if the number of active blocks remains fixed. In this case, the size of each subsequent active block may be different than the previous block. For example, as the data availability rate grows the size of subsequent active blocks may also grow, and as the sending rate grows the size of subsequent active blocks may grow. The length of each active block may be a function of time, e.g., at most so much time may pass before a new block is formed, it may be a function of length, i.e., each block may be at most so long, or it may be a combination of these and other factors.

The end of one block and the start of the next block may be decided automatically by the interleaved reliability control protocol, it may be determined by an application, or some combination of these and other factors. For example, a block of the data stream may have logical meaning to an application, e.g., a Group of Pictures block or an I-frame for an MPEG stream, and thus the way that the interleaved reliability control protocol partitions the stream of data into blocks may respect the boundaries of the logical application blocks. Alternatively, the application may indicate to the interleaved reliability control protocol preferred boundaries between blocks, and the interleaved reliability control protocol tries to respect these boundaries as well as possible but may still be allowed to make boundaries between blocks at points besides those supplied by the application.

Another variant of the interleaved reliability control protocol is to allow the protocol to not deliver all blocks reliably in sequence to the receiver, but instead to try as well as possible to achieve this goal subject to other constraints. For example, in a streaming application it may be important to deliver the stream of data as reliably as possible, but there are also other constraints such as timing constraints on the data stream. For example, it could be the case that after a certain time a certain portion of the data is no longer relevant, or that there are strong limits on how much latency the interleaved reliability control protocol can introduce, e.g., in an interactive Video conferencing application. In these cases, the sender interleaved reliability control protocol and receiver interleaved reliability control protocol may be modified to allow some of the blocks to be skipped before they are completely recovered. For example, the sender interleaved reliability protocol may be constrained to only allow an active block to be active for a given amount of time, or it may have hard time constraints for each block supplied by an application after which it is no longer allowed to send encoding units for the block, or it may be allowed to only send a provided maximum number of encoding units for each block, or any combination of these constraints. Similar constraints may be applicable to the receiver interleaved reliability control protocol. For these applications, the interleaved reliability control protocol can be modified to respect these constraints.

In some variants of interleaved reliability control protocols, there is one sender and one receiver. Other variants include but are not limited to: one sender and multiple receivers; one receiver and multiple senders; multiple senders and multiple receivers. For example, in the one sender/multiple receiver variant when the sending channel is a broadcast or multicast channel, the sender reliability control protocol could be modified so that the sender computes for each active block i the value of R_i as the minimum number of received acknowledged encoding units from any receiver in step 1010 of FIG. 10. As another example for the one sender/multiple receiver variant when the sender sends a separate stream of packets to each receiver, the sender reliability control protocol could be modified so that the sender computes for each active block i and for each receiver j the value of R_ij as the number of received acknowledged encoding units from receiver j for active block i and computes L_ij=B_i−R_ij in step 1010 of FIG. 10, and U_ij could be computed as the number of sent but still unacknowledged encoding units for active block i sent to receiver j, and then the condition in step 1015 could be changed to determine if there is an active block i such that, for some receiver j, L_ij+X_i−U_ij>0. As another example, for the many sender/one receiver variant, the receiver reliability control protocol could be modified so that the receiver receives encoding units concurrently from multiple senders, for the same or different active blocks, and sends receiver feedback either by a broadcast or multicast channel to all senders, or using a separate packet stream with potentially separate receiver feedback to each sender. As another example, for the multiple sender/multiple receiver variant, the modified steps described above for the one sender/multiple receiver case and the multiple sender/one receiver case can be combined.

Another variant is that a sender may concurrently be sending multiple data streams, each using a separate instance of a sender interleaved reliability control protocol, or a version of a sender interleaved reliability control protocol that takes into account the different data streams, e.g., the aggregate sending rate for all packets for all streams may be limited, and thus the sender may decide to prioritize sending packets for some data streams over others. Similarly, a receiver may concurrently be receiving multiple data streams, each using a separate instance of a receiver interleaved reliability control protocol, or a version of a receiver interleaved reliability control protocol that takes into account the different data streams, e.g., the aggregate receiving rate for all packets for all streams may be limited, and thus the sender may decide to prioritize receiving packets and processing and sending receiver feedback for some data streams over others.

Any of the above variants can be combined with one another. For example, the protocol where some blocks may not be reliably delivered to receivers due to for example to timing and/or bandwidth limitations can be combined with the multiple sender/multiple receiver variant.

What is claimed is:

1. A method of reliably transporting data from a sender to a receiver, the method comprising:

organizing the data to be transported into data blocks, wherein each data block comprises a plurality of encoding units;

transmitting encoding units of a first data block from the sender to the receiver;

detecting, at the sender, acknowledgments of receipt of encoding units by the receiver;

determining, at the sender, a success probability that the receiver received or will receive sufficient encoding units of the first data block to recover the first data block at the receiver based on results of the detecting;

testing the success probability against a threshold probability to determine whether a predetermined test is met;

following the step of testing and prior to the sender receiving confirmation of recovery of the first data block at the receiver, when the predetermined test is met, transmitting encoding units of a second data block from the sender to the receiver; and if an indication of failure to recover the first data block is received at the sender, sending further encoding units for the first data block from the sender to the receiver.

2. The method of claim 1, wherein each encoding unit is an IP packet.

3. The method of claim 1, wherein the indication of failure is an explicit failure notice sent from the receiver and received by the sender.

4. The method of claim 1, wherein the indication of failure is generated for the sender in response to a failure to receive an acknowledgment from the receiver of successful recovery of the first data block within a time period determined at the sender.

5. The method of claim 1, wherein the further encoding units for the first data block are additional encoding units other than the encoding units sent prior to the step of testing.

6. The method of claim 1, wherein the further encoding units for the first data block are resent copies of encoding units sent prior to the step of testing.

7. The method of claim 1, wherein encoding units are encoded using a chain reaction coding process.

8. The method of claim 1, wherein encoding units are encoded using a Tornado coding process.

9. The method of claim 1, wherein encoding units are encoded using a forward error correcting coding process having a predetermined code rate

* * * * *